(12) United States Patent
Hsueh et al.

(10) Patent No.: US 9,958,772 B1
(45) Date of Patent: May 1, 2018

(54) RETICLE POD

(71) Applicant: GUDENG PRECISION INDUSTRIAL CO., LTD, New Taipei (TW)

(72) Inventors: Hsin-Min Hsueh, New Taipei (TW); Chia-Ho Chuang, New Taipei (TW); Cheng-Ju Lee, New Taipei (TW); Jeng-Jie Huang, New Taipei (TW)

(73) Assignee: Gudeng Precision Industrial Co., Ltd., New Taipei (TW)

( * ) Notice: Subject to any disclaimer, the term of this patent is extended or adjusted under 35 U.S.C. 154(b) by 0 days. days.

(21) Appl. No.: 15/651,312

(22) Filed: Jul. 17, 2017

Related U.S. Application Data (60) Provisional application No. 62/450,871, filed on Jan. 26, 2017.

(51) Int. Cl.
| | | |
|---|---|---|
| *B65D 81/00* | (2006.01) | |
| *G03F 1/66* | (2012.01) | |
| *H01L 21/673* | (2006.01) | |
| *B65D 25/10* | (2006.01) | |
| *B65D 85/38* | (2006.01) | |

(52) U.S. Cl.
CPC ............ *G03F 1/66* (2013.01); *B65D 25/10* (2013.01); *B65D 85/38* (2013.01); *H01L 21/67359* (2013.01)

(58) Field of Classification Search
USPC ............... 206/454, 455, 591, 592, 594, 521
See application file for complete search history.

(56) References Cited

U.S. PATENT DOCUMENTS

| | | | | |
|---|---|---|---|---|
| 7,009,689 B2* | 3/2006 | Chiu | ................ | G03B 27/62 |
| | | | | 206/454 |
| 7,581,639 B2* | 9/2009 | Chiu | ................ | G03F 1/66 |
| | | | | 206/454 |
| 8,083,063 B2 | 12/2011 | Lu et al. | | |
| 8,418,853 B2* | 4/2013 | Ku | ................ | H01L 21/67359 |
| | | | | 206/454 |
| 2002/0066692 A1* | 6/2002 | Smith | ................ | G03F 1/66 |
| | | | | 206/710 |
| 2003/0213716 A1* | 11/2003 | Cleaver | ............ | H01L 21/67346 |
| | | | | 206/454 |

(Continued)

FOREIGN PATENT DOCUMENTS

| | | |
|---|---|---|
| CN | 202956584 U | 5/2013 |
| TW | M335007 U | 6/2008 |

(Continued)

*Primary Examiner* — Jacob K Ackun
(74) *Attorney, Agent, or Firm* — Muncy, Geissler, Olds & Lowe, P.C.

(57) ABSTRACT

A reticle pod is provided for receiving a reticle, the reticle pod comprises: a plurality of positioning modules, which are disposed on at least one vertex portions of a substrate of the reticle pod. The positioning module includes an elastic member, and an abutting member which disposed above the positioning module, wherein when the reticle is received in the reticle pod and the cover of the reticle pod is engaged to the substrate, the cover contacts and provides a downward pressure to the abutting member, and forcing the abutting member to compress the elastic member. The compressed elastic member deforms extensively along a transverse direction and contacts with the reticle.

11 Claims, 8 Drawing Sheets

(56) References Cited

U.S. PATENT DOCUMENTS

| | | | | |
|---|---|---|---|---|
| 2009/0218254 A1* | 9/2009 | Andersen | ............... | G03F 1/66 206/724 |
| 2009/0301917 A1* | 12/2009 | Kolbow | ............... | G03F 1/66 206/454 |
| 2010/0140126 A1* | 6/2010 | Lu | ............... | A45C 11/00 206/454 |
| 2010/0294688 A1* | 11/2010 | Chiu | ............... | B65D 85/48 206/455 |
| 2012/0175279 A1* | 7/2012 | Ku | ............... | G03F 1/66 206/454 |

FOREIGN PATENT DOCUMENTS

| TW | M409519 U | 8/2011 |
|---|---|---|
| TW | I370093 B | 8/2012 |
| TW | I378887 B | 12/2012 |
| TW | 201420462 A | 6/2014 |
| TW | I535642 B | 6/2016 |

\* cited by examiner

FIG. 8 a reticle pod having a plurality of positioning module for
RETICLE POD

CROSS REFERENCE TO RELATED APPLICATION

This application claims the benefit of filing date of U.S. Provisional Application Ser. No. 62/450,871 filed on Jan. 26, 2017, the subject matter of which is incorporated herein by reference.

BACKGROUND OF THE INVENTION

1. Field of the Invention

The present invention relates to a reticle pod, particularly, to a reticle pod having a plurality of positioning module for fixing the reticle.

2. Description of Related Art

Optical lithography plays an important role in the semiconductor industry. The reticle used for patterning should be spotless, any kind of dust particles that adhere to the reticle or scratches may result in quality degradation of the projected pattern, therefore, the reticle is required to be absolutely dust-free during the processes of manufacturing, processing, shipping, transporting, and storing, any collision or friction that might affect the clarity of the reticle should be prevented.

Typically, the reticle should be stored in a reticle pod for transporting process to avoid contaminations. The reticle should be firmly fixed in the reticle pod to prevent any damage caused by friction or displacement. Also, the contact area between the reticle pod and the reticle should be smaller in order to prevent damages caused by contact or friction between the reticle and the reticle pod.

Accordingly, most of the commercialized reticle pods include components for fixing or supporting the reticle. However, those components are formed integrally around the reticle pod and fail to absorb the vibration so that the reticle may easily be damaged or be contaminated. In addition, the placement of the reticle in the reticle pod is difficult to be positioned because there is no placement guides are disposed in the common reticle pods, dislocation of the reticle may easily occur and results in damage of the reticle.

In order to solve the aforementioned location problems, TW patent laid-open NO. 201420462 disclosed a reticle carrier with an inner pod having a plurality of reticle contact members, which serve as placement guides for the reticle. However, when the reticle is received in the reticle carrier, the collision between the reticle contact members and the reticle may generate dust particles that contaminate the reticle.

Accordingly, a novel reticle pod is required, which comprises a novel positioning device that can accurately locate the position of the reticle in the reticle pod and absorb the vibration during the transporting process in order to prevent any collision or friction between the reticle and the reticle pod that might affect the clarity of the reticle.

SUMMARY OF THE INVENTION

To achieve the object mentioned above, the present invention provides a reticle pod for receiving a reticle, which comprises: a base having four vertex portion; a cover corresponding to the base and engaging with respect to the base; and a plurality of positioning module disposed on at least one of the vertex portion, the positioning module comprises: a soft member; and an abutting member disposed above the soft member. When the reticle is received in the reticle pod and the cover is engaged with the base, the cover contacts the abutting member and provides a downward pressure against the abutting member, and the abutting member is driven to compress the soft member in a longitudinal direction, so that a force is applied to the soft member and the soft member is deformed in a horizontal direction and contacts with the reticle.

The number of the positioning modules may be 2 to 8, or may be an even. Also, the positioning modules are preferably disposed symmetrically in pairs at the corners or sides of the base with respect to the center of the base. Most preferably, four positioning module may be disposed respectively at four vertex portion and efficiently fix the reticle diagonally.

According to one embodiment of the present invention, when the force is applied to the soft member, the deformation elongation of the soft member is 0.1 mm to 3.0 mm in the horizontal direction.

In one embodiment, the soft member may have a solid structure or a hollow structure, and the material of the soft member is not particularly limited as long as the deformation elongation in the horizontal direction thereof may meet the abovementioned requirement.

In a preferred embodiment, the soft member has a hollow structure and the positioning module further includes an elastic component being disposed in the hollow structure. When the reticle is received in the reticle pod and the cover is engaged with the base, the downward force provided by the cover compress the elastic component and the soft member; and when the cover is removed, the elastic component provides an upward elastic force to reinstate the shape of the soft member. The elastic component is preferably a spring.

In one embodiment, the Shore hardness of the soft member is A20 to A70. The soft member is made of silicone material, wherein the silicone of A50 Shore hardness is preferable.

In one embodiment, the positioning module further comprises a shell, which has a first opening facing the reticle and a second opening formed on the top of the shell; the shell covers a portion of the soft member from above and a portion of the abutting member protrudes out of the shell through the second opening.

In one embodiment, the reticle pod further comprises a supporting module, which is disposed on the base and partially protrudes out of the base. When the reticle is received in the reticle pod, the supporting module abuts against the reticle through a convex part, therefore, the reticle does not contact with the base when received in the reticle pod.

The abovementioned supporting module comprises a box having an opening; a support member having a protruding part and a main body and disposed in the box with a portion of the protruding part protrudes out of the box through the opening; and a plurality of shifting members being disposed between the box and the main body; wherein the supporting member moves correspondingly to the box in a horizontal direction through the shifting members.

In one embodiment, to avoid the friction between the supporting member and the reticle when they contact to each other, the material used to prepare the supporting member should have a larger coefficient of friction. Accordingly, the supporting member is made of a plastic material which may be selected from the group consisting of polyvinyl chloride (PVC), poly (methyl methacrylate) (PMMA), polystyrene (PS), polyamide (PA), polyethylene (PE), polytetrafluoroethylene (PTFE), polypropylene (PP), acrylonitrile-butadiene-styrene copolymer (ABS), phenol formaldehyde resin (PF), urea resin (UF), melamine resin (MF), unsaturated polyester (UP), epoxy resin (EP), polyurethane (PU), polycarbonate (PC), polybutylene terephthalate (PBT), Nylon-66 (PA-66), Nylon-6 (PA-6), polyoxymethylene (POM), polyphenylene sulfide (PPS), polyether ether ketone (PEEK), polyamide-imide (PAI), polyetherimide (PEI), polyimide (PI), and mixture thereof. As long as there is no friction or displacement between the supporting member and the reticle, the plastic material may be within the scope of the present invention.

In one embodiment, the shifting member may be configured with a first magnetic element and a second magnetic element, wherein the first magnetic element and the second magnetic element in each of the shifting member are magnetically attracted or repulsive in order to separate the supporting member and the box. The polarity of the first magnetic element and the second magnetic element may be N pole or S pole. For example, if the first magnetic element and the second magnetic element are magnetically repulsive, the repulsive force of each pair of the first magnetic elements and the second magnetic elements should be the same so that the supporting element and the box may be separated.

In another embodiment of the present invention, the shifting member is a ball, and ball slots that correspond to those balls are formed on the supporting element or the main body for the balls to be embedded thereinto, and the balls may roll in the corresponding ball slots.

However, in other embodiments of the present invention, the shifting elements may be a cylinder, a wheel, or a liquid so that the supporting element may move with respect to the box.

In one embodiment, the box may comprise a plurality of dust extraction channels, the dust extraction channels extends through a bottom of the box and interconnect to the ball slots that formed at the bottom of the box, so that the dust generated by the balls rolling in the ball slots may be discharged through the dust extraction channels. In addition, the box may further comprise a filter disposed at the bottom of the box and cover the dust extraction channels for preventing contaminate enter the reticle pod.

In another embodiment, the supporting element may further comprise at least one spacer formed on a side surface of the main body and contact the box to separate the main body and the box. The spacer may be formed by elastic materials, the shape and quantity thereof are not particularly limited, as long as the main body and the box may be separated and limiting the displacement of the main body with respect to the box.

DETAILED DESCRIPTION OF THE PREFERRED EMBODIMENT

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Figure 1:
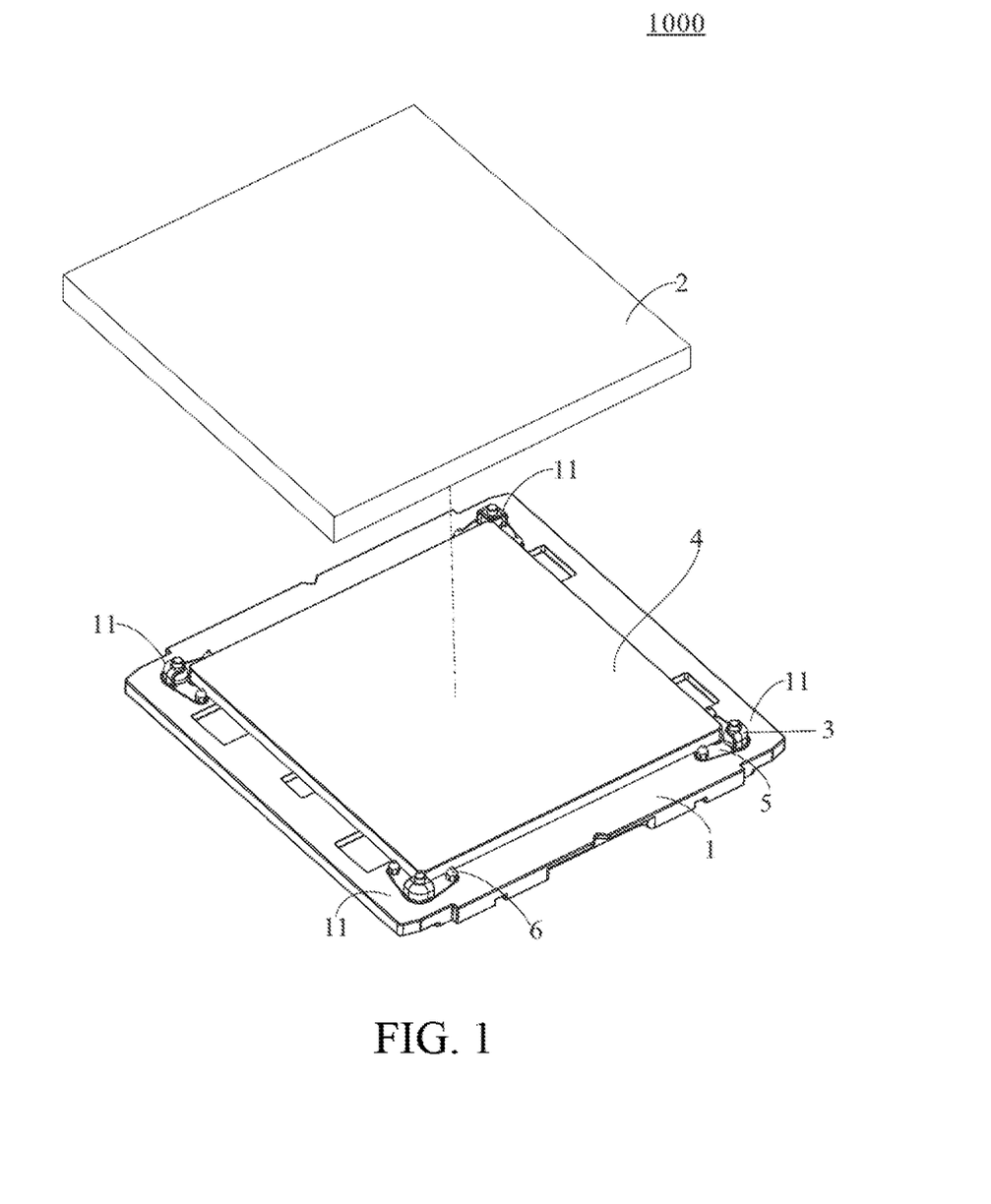
FIG. 1 is a perspective view of the reticle pod of one embodiment of the present invention.

The reticle pod 1000 of a preferred embodiment of the present invention is illustrated in FIG. 1. The reticle pod 1000 comprises a base 1, a cover 2, four positioning modules 3, a reticle 4, four supporting modules 5, and eight locators 6. Wherein the reticle 4 is placed on the base 1 and is positioned by four positioning modules 3 and eight locators 6 that are disposed respectively on four of the vertex portions 11 of the base 1. In addition, the cover 2 corresponds to the base 1 and may be engaged with the base 1 to accommodate the reticle 4.

Figure 2:
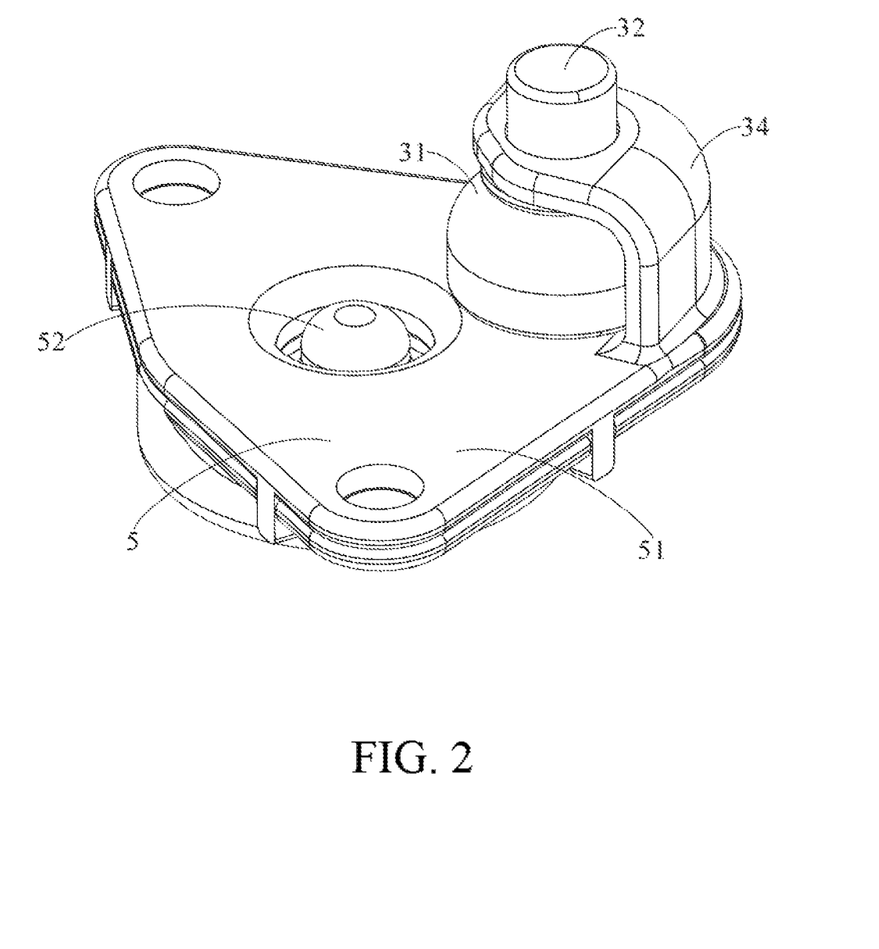
FIG. 2 is a perspective view of the positioning module and the supporting module of one embodiment of the present invention.
Figure 3:
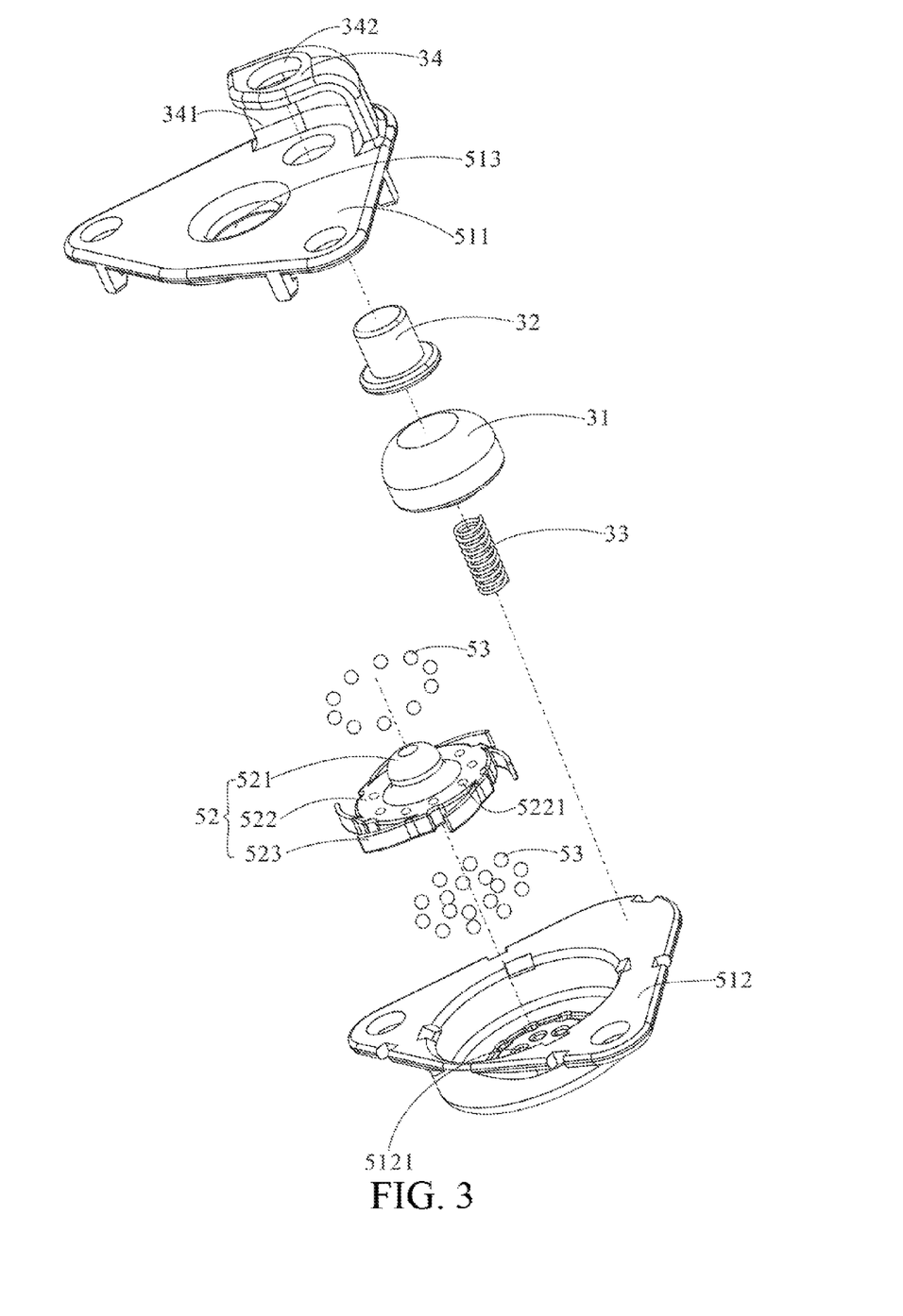
FIG. 3 is an explosive view of the positioning module and the supporting module of one embodiment of the present invention.
Figure 4:
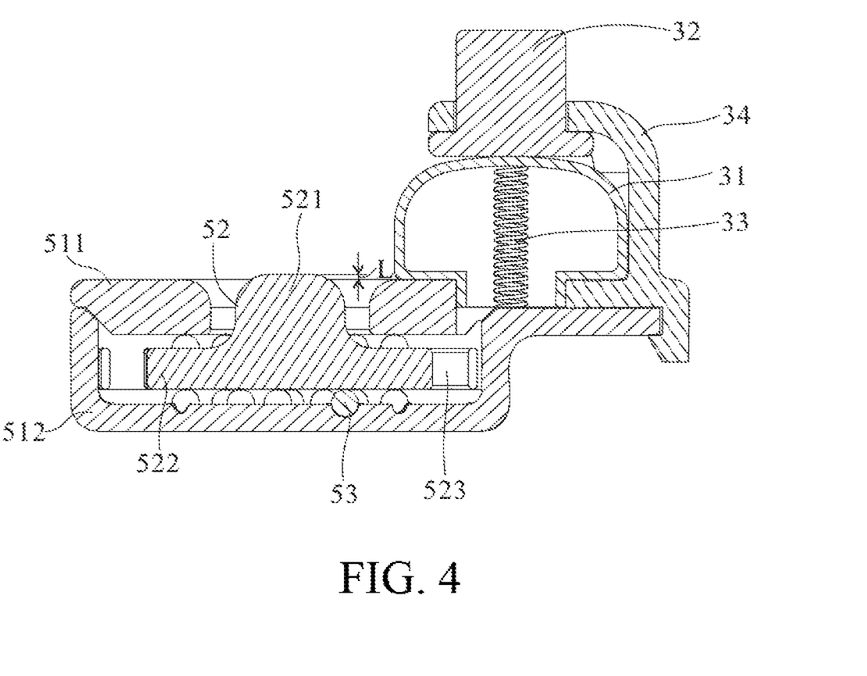
FIG. 4 is cross-section view of the positioning module and the supporting module of one embodiment of the present invention.

Particularly, please refer to the perspective view of the positioning module 3 and supporting module 5 that illustrated in FIG. 2; the explosive view of the positioning module 3 and supporting module 5 that illustrated in FIG. 3; and the cross-section view of the positioning module 3 and the supporting module 5 that illustrated in FIG. 4. The positioning module 3 is disposed on a cover body 511 of the supporting module 5 and comprises a soft member 31, an abutting member 32, an elastic component 33, and a shell 34. The shell 34 has a first opening 341 and a second opening 342, wherein the first opening 341 faces toward the reticle 4, the soft member 31 is disposed inside the shell 34, and a portion of the soft member 31 exposed from the first opening 341 and a portion of the soft member 31 is covered by the shell from above. In addition, the abutting member 32 is disposed above the soft member 31 and contact with the soft member 31, a portion of the abutting member 32 protruded out from the shell 34 through the second opening 342. Furthermore, the soft member 31 may have a hollow structure and may deform when a force is applied thereto. The elastic component 33 is disposed in the soft member 31 and may be compressed in a longitudinal direction. Also, the supporting module 5 comprises a box 51, a supporting member 52, and a plurality of shifting members 53. Wherein the box 51 includes the cover body 511, a main body 512, and an opening 513 formed on the cover body 511; the supporting member 52 includes a protruding part 521, a body part 522, and six spacers 523. The protruding part 521 is formed on one surface of the body part 522 and the spacers 523 are formed on a side surface of the main body 522. The supporting member 52 is accommodated in the box 51 with a portion of the protruding part 521 protrudes from the opening 513 of the box 51 and extend beyond the cover body 511. The shifting members 53 are disposed between the body part 522 of supporting member 52 and the box 51. More specifically, a plurality of balls, which serve as shifting members 53, are disposed between the body part 522 of the supporting member 52 and the main body 512 of the box 51, and between the body part 522 of the supporting member 52 and the cover body 511 of the box. A plurality of first ball slots 5221 are formed at the body part 522 of the supporting member 52; and a plurality of second ball slots 5121 are formed at the bottom of the main body 512 of the box 51 for accommodates the balls. Also, a plurality of dust extraction channels 514 is formed beneath each of the second ball slots 5121, interconnect to the second ball slots 5121, and extend through the bottom of the main body 512. In addition, one end of the spacers 523 away from the body part 522 abuts against the inner surface of the box 51 for maintaining the gap between the body part 522 and the box 51 horizontally. Furthermore, the locators 6 are disposed on the cover body 511 of the box 51 in pairs.

The soft member 31 is preferably made of soft materials with elasticity so that the soft member 31 may deform when a force is applied thereon. In the present embodiment, the soft member 31 is made of a plastic material, of which the shore hardness is A20 to A70, however, the present invention is not limited thereto. In addition, in order to prevent particles generated by the displacement between the supporting member 52 and the reticle 4 while the supporting member 52 contacts with the reticle 4, the supporting member 52 is preferably made of a material with higher static friction coefficient so that static friction between the supporting member and the reticle 4 may constantly larger than the weight of the reticle 4 that supported by the supporting member 52. In the present embodiment, the supporting member 52 is made of a plastic material.

Figure 5:
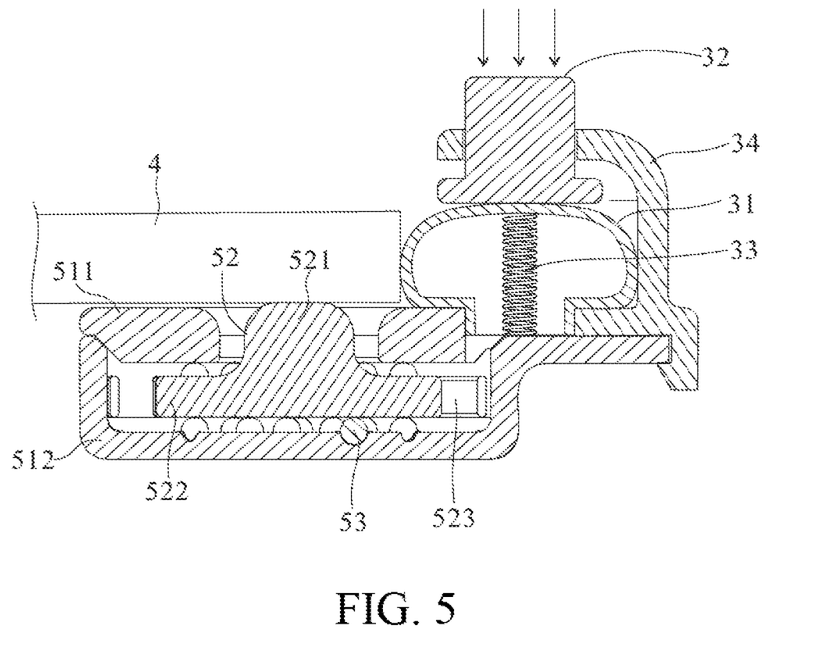
FIG. 5 is cross-section view of the positioning module and the supporting module of one embodiment of the present invention.

According to the abovementioned structural description, when the reticle 4 is placed on the base 1, locators 6 disposed in pairs at each of the vertex portion 11 may contact two sides of the reticle 4 to make sure that the reticle 4 is placed at a predetermined position. Further, please refer to FIG. 5, when the cover 2 covers the reticle 4 from above and engages to the base 1, the cover 2 contacts and abuts against the abutting member 32 and provides a downward pressure to the abutting member 32, wherein the direction of the downward pressure is shown by the arrow in FIG. 5. The abutting member 32 applies a pressure in a longitudinal direction to compress the soft member 31 and the elastic component 33 inside the soft member 31. The compressed and deformed soft member 31 contact with the reticle 4 in a horizontal direction, and the deformation elongation of the soft member is 0.1 mm to 3.0 mm in the horizontal direction. Accordingly, four of the soft members 31 disposed respectively at four vertex portions 11 are in contact with four corners of the reticle 4 and provide a thrust against the reticle 4 to fix the reticle 4. Due to the softness of the soft members 31, the soft members 31 may serve as a shock absorber for the reticle 4 to avoid displacement or collision of the reticle 4 during the relocating processes of the reticle pod 1000.

The reticle 4 does not contact with the base 1 directly when the reticle 4 is placed on the base 1. The reticle 4 contacts with and is supported by four supporting modules 5 that disposed at four vertex portions 11. Please refer to the enlarged diagram of the supporting module 5 that illustrated in FIG. 6, the supporting module 5 contacts with the reticle 4 with its protruding part 521 and maintains a gap L between the reticle 4 and the base 1 to avoid direct contact therebetween. Furthermore, a plurality of balls is disposed between the body part 522 of the supporting member 52 and the box 51 as the shifting members 53 so that the supporting member 52 may shift horizontally with respect to the box 51. Also, the spacers 523 may maintain the gap between the supporting member 52 and the box 51 to avoid collisions. Accordingly, if the displacement of the reticle 4 occurs due to collision when the reticle 4 is accommodated in the reticle pod 1000, the supporting member 52 contacting with the reticle 4 may slightly shift in the horizontal direction with the reticle 4, therefore, damages caused by or dust particles generated by friction between the protruding part 521 of the supporting member 52 and the reticle may be avoided.

Figure 6:
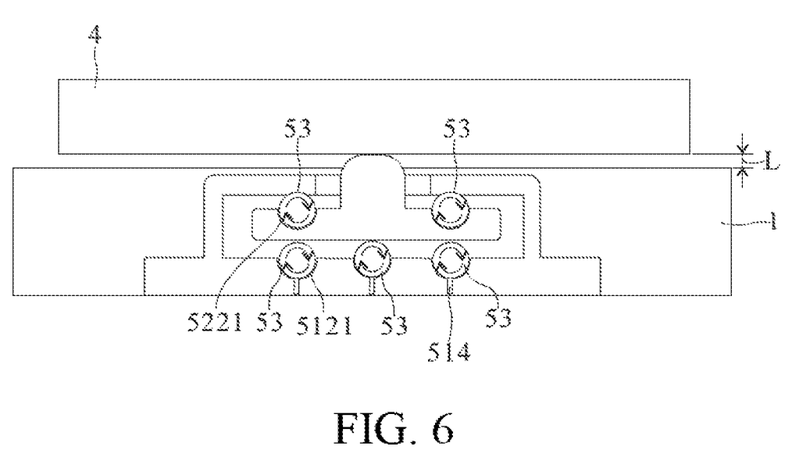
FIG. 6 is a schematic diagram of the supporting module of one embodiment of the present invention.

Additionally, when the balls roll in the first ball slots 5121 or the second ball slots 5221, particles may be generated by the friction between the balls and the ball slots, at the meantime, the particles may be discharged out of the reticle pod 1000 through the dust extraction channels 514 to avoid contamination of the reticle 4.

Figure 7:
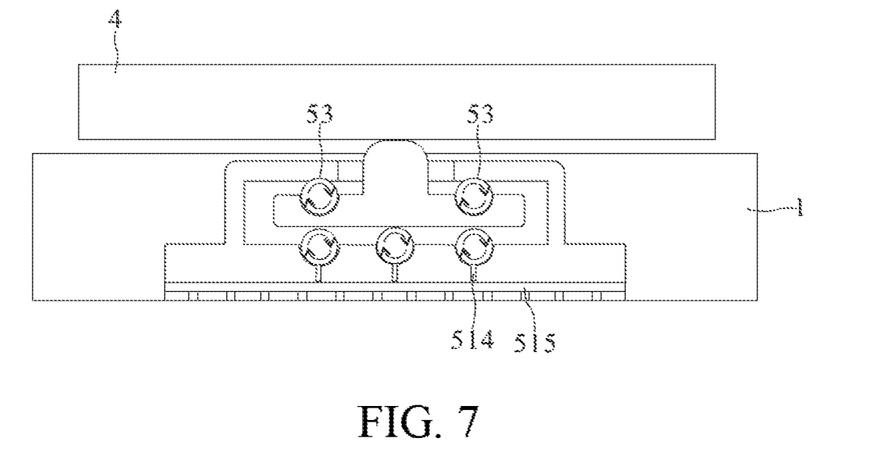
FIG. 7 is a schematic diagram of the supporting module of another embodiment of the present invention.

Furthermore, as illustrated in FIG. 7, a filter 515 may be disposed at the exit of the dust extraction channels 514 to separate the outer and the inner of the reticle pod 1000 interconnected by the extraction channels to avoid contaminates enter into the reticle 4.

Figure 8:
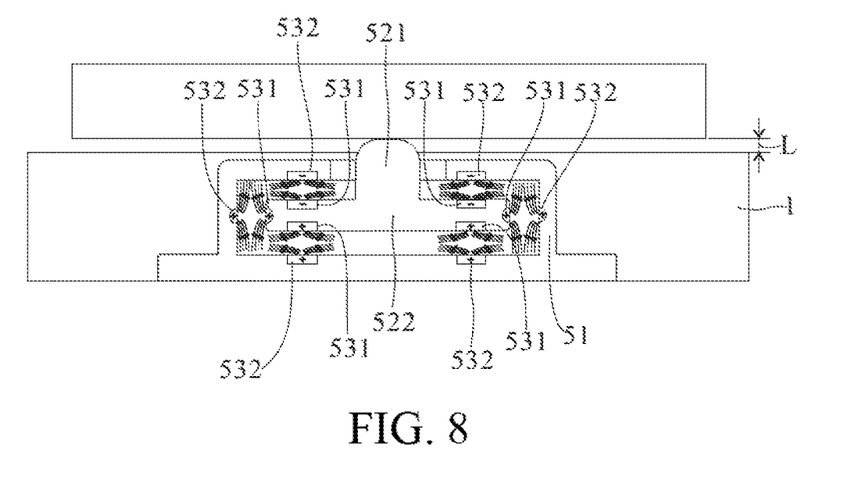
FIG. 8 is a schematic diagram of the supporting module of another embodiment of the present invention.

Another embodiment of the present invention, two opposing surfaces of the body part 522 of the supporting member 52 and the box 51 are disposed correspondingly with a first magnetic element 531 and a second magnetic element 532 respectively as the shifting members 53. For instance, as illustrated in FIG. 8, three first magnetic elements 531 are disposed on the surface of body part 522, and three second magnetic elements 532 are disposed on the surface of the box 51 with respect to the first magnetic elements 531. The first magnetic elements 531 and the second magnetic elements 532 are magnetically repulsive to each other. Alternatively, in other embodiment, the first magnetic element 531 and the corresponding second magnetic element 532 may be magnetic attractive, which is not particularly limited. The supporting member 52 may not contact to the box 51 due to the repulsive force between the first magnetic element 531 and the second magnetic element 532, and the supporting member 52 may slightly shift horizontally with respect to the box 51.

However, in other embodiments, the shifting members may be a cylinder, a wheel, or a liquid so that the supporting member may shift with respect to the box.

Accordingly, the reticle pod provided by the present invention may accurately locate the position of the reticle in the reticle pod and may prevent the horizontal or longitudinal displacement of the reticle caused by vibration. Also, the particles generated by the friction between the reticle and the reticle pod may be efficiently reduced to ensure the cleanness and quality of the reticle.

Although the present invention has been explained in relation to its preferred embodiment, it is to be understood that many other possible modifications and variations can be made without departing from the spirit and scope of the invention as hereinafter claimed.

What is claimed is:

1. A reticle pod for receiving a reticle, which comprises:
   a base having four vertex portion;
   a cover corresponding to the base and engaging with respect to the base; and
   at least one positioning modules disposed on at least one of the vertex portion, the positioning module comprises:
   a soft member; and
   an abutting member disposed above the soft member;

wherein the reticle is received in the reticle pod and the cover is engaged with the base, the cover contacts the abutting member and provides a downward pressure against the abutting member; the abutting member is driven to compress the soft member in a longitudinal direction, so that a force is applied to the soft member and the soft member is deformed in a horizontal direction and contacts to the reticle.

2. The reticle pod as claimed in claim 1, wherein when the force is applied to the soft member, the deformation elongation of the soft member is 0.1 mm to 3.0 mm in the horizontal direction.

3. The reticle pod as claimed in claim 1, wherein the Shore hardness of the soft member is A20 to A70.

4. The reticle pod as claimed in claim 1, wherein the soft member has a hollow structure.

5. The reticle pod as claimed in claim 1, wherein the positioning module further comprises an elastic component being disposed inside the hollow structure of the soft member, when the reticle is received in the reticle pod, the downward force provided by the cover compress the component and the soft member; and when the cover is removed, the elastic component provides an upward elastic force to reinstate the shape of the soft member.

6. The reticle pod as claimed in claim 1, wherein the soft member is made of a silicone material.

7. The reticle pod as claimed in claim 1, wherein the positioning module further comprises a shell, which has a first opening facing the reticle and a second opening formed on the top of the shell; the shell covers a portion of the soft member from above and a portion of the abutting member protrudes out of the shell through the second opening.

8. The reticle pod as claimed in claim 1, further comprises a supporting module, which is disposed on the base and partially protrudes out of the base, when the reticle is received in the reticle pod, the supporting module abuts against the reticle through a convex part.

9. The reticle pod as claimed in claim 8, wherein the supporting module comprises a box having an opening; a supporting member having a protruding part and a main body and disposed in the box with a portion of the protruding part protrudes out of the box through the opening; and a plurality of shifting members being disposed between the box and the main body; wherein the supporting member moves correspondingly to the box in a horizontal direction through the shifting members.

10. The reticle pod as claimed in claim 9, wherein the supporting member is made of an elastic material.

11. The reticle pod as claimed in claim 9, wherein the shifting member is a ball, a cylinder, a wheel, a liquid, or a magnetic element.

* * * * *